United States Patent
Tung et al.

(10) Patent No.: US 7,420,398 B1
(45) Date of Patent: Sep. 2, 2008

(54) PULSE EXTENSION CIRCUITS FOR EXTENDING PULSE SIGNALS

(75) Inventors: Chia-Hsin Tung, Hsinchu (TW); Liang-Kuei Hsu, Chiayi County (TW)

(73) Assignee: NOVATEK Microelectronics Corp., Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 11/740,872

(22) Filed: Apr. 26, 2007

(30) Foreign Application Priority Data

Mar. 13, 2007 (TW) .............................. 96108648 A (51) Int. Cl.
*H03K 3/017* (2006.01)
(52) U.S. Cl. ...................................... 327/174; 327/172
(58) Field of Classification Search ........................ None
See application file for complete search history.

(56) References Cited

U.S. PATENT DOCUMENTS

| | | | | | |
|---|---|---|---|---|---|
| 5,682,113 | A | * | 10/1997 | Park et al. .................... | 327/174 |
| 6,016,070 | A | * | 1/2000 | Uehara ........................ | 327/176 |
| 6,060,923 | A | * | 5/2000 | Sasaki ......................... | 327/175 |
| 6,753,713 | B1 | * | 6/2004 | Barth et al. .................. | 327/174 |
| 6,838,919 | B1 | * | 1/2005 | Kaviani ....................... | 327/172 |
| 7,299,374 | B2 | * | 11/2007 | Dawson et al. .............. | 713/501 |

* cited by examiner

*Primary Examiner*—Cassandra Cox
(74) *Attorney, Agent, or Firm*—Winston Hsu (57) ABSTRACT

A pulse extension circuit for extending a pulse signal includes an input unit for receiving the pulse signal, an edge detection unit coupled to the input unit for generating a initiation signal, a pulse initiation unit coupled to the edge detection unit for outputting a control signal and adjusting a voltage level of the control signal, a pulse width control unit coupled to the pulse initiation unit for outputting a termination signal, a reset unit coupled to the edge detection unit, the pulse initiation unit and the pulse width control unit for outputting the first reset signal and the second reset signal to reset the pulse initiation unit and the pulse width control unit, and an output unit coupled to the input unit and the pulse initiation unit for extending a signal period of the pulse signal according to the pulse signal and the control signal.

11 Claims, 10 Drawing Sheets

PULSE EXTENSION CIRCUITS FOR EXTENDING PULSE SIGNALS

BACKGROUND OF THE INVENTION

1. Field of the Invention

The present invention relates to a pulse extension circuit for extending a pulse signal, and more particularly, to a pulse extension circuit for controlling a pulse extension signal by an initiation signal and a termination signal.

2. Description of the Prior Art

In the prior art, a pulse extension circuit for extending pulse signals utilizes serialized flip-flop circuits for extending the inputted pulse signals. However, if the inputted pulse signal is too short, for instance, if the inputted pulse signal is shorter than a period of a clock signal, the flip-flop circuits cannot sample such short pulse signals according to the clock signal, so that a desired pulse extension signal cannot be generated.

Figure 1:
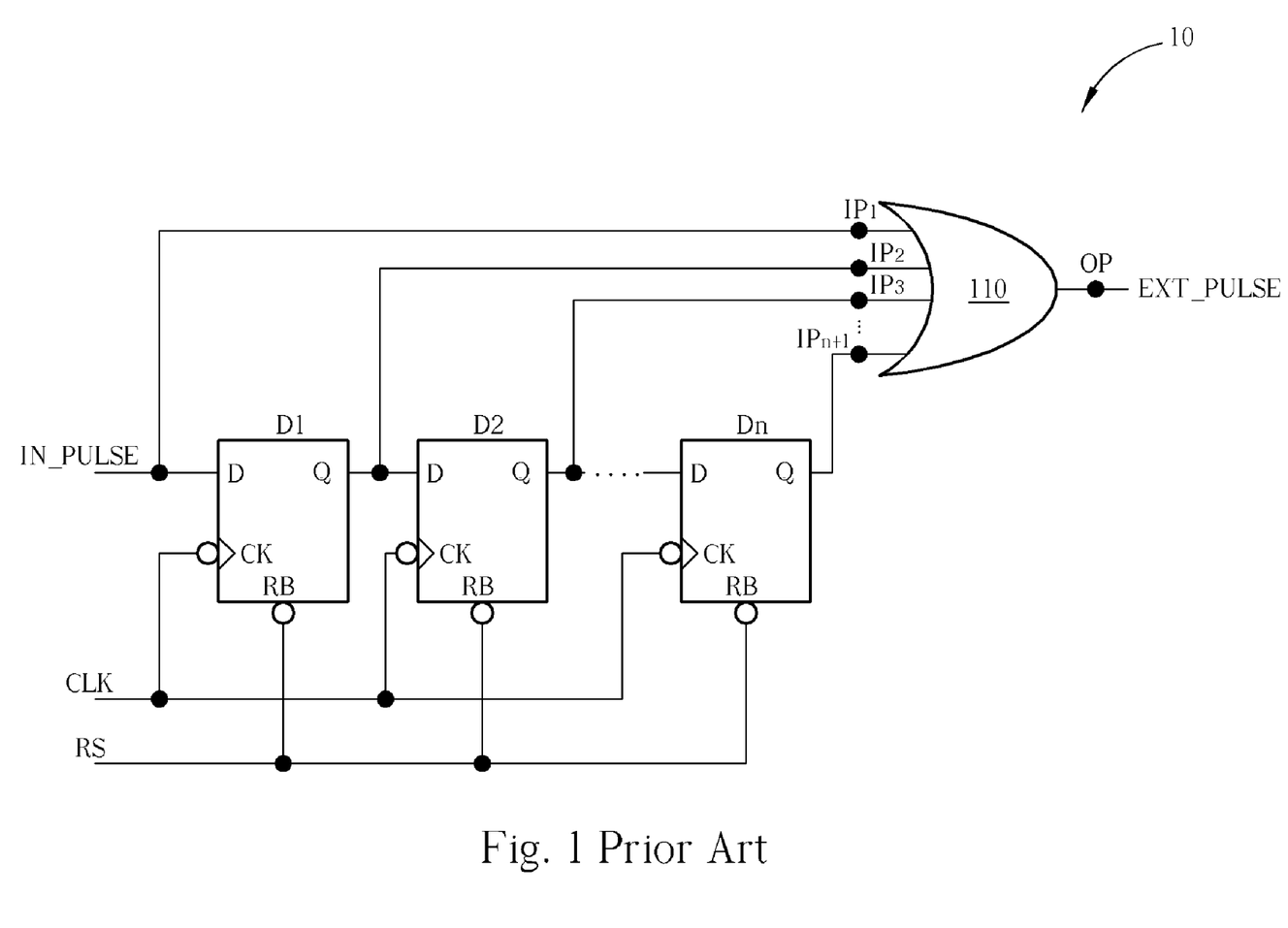
FIG. 1 is a schematic diagram of a prior art pulse extension circuit.

Please refer to FIG. 1. FIG. 1 is a schematic diagram of a prior art pulse extension circuit 10. The pulse extension circuit 10 includes D-type flip-flops D1~Dn and an OR gate 110. Each D-type flip-flop includes a clock input terminal CK, a data input terminal D, an output terminal Q and a reset terminal RB. The D-type flip-flops D1~Dn are coupled in series, i.e., the data input terminal D of each D-type flip-flop is coupled to the output terminal Q of a previous D-type flip-flop, among which the data input terminal D of the first D-type flip-flop D1 is utilized for receiving a pulse signal IN_PULSE and the output terminal Q of the last D-type flip-flop Dn is directly coupled to the OR gate 110. Moreover, the clock input terminal CK of each D-type flip-flop is utilized for receiving a clock signal CLK. When the clock signal CLK received by the clock input terminal CK is at a descending edge, each of the D-type flip-flops D1~Dn samples signals of the data input terminal D, and outputs sampling results through the output terminal Q. The reset terminal RB is utilized for receiving a reset signal RS, so as to reset a corresponding D-type flip-flop according to a logic state of the reset signal RS. The OR gate 110 includes input terminals $IP_1$~$IP_{(n+1)}$ and an output terminal OP. The input terminals $IP_1$~$IP_{(n+1)}$ are individually coupled to the pulse signal IN_PULSE and the output terminals Q of the D-type flip-flops D1~Dn are respectively utilized for receiving the pulse signal IN_PULSE and output signals of the D-type flip-flops D1~Dn; and the output terminal OP is utilized for outputting an OR operation result of the OR gate 110.

Figure 2:
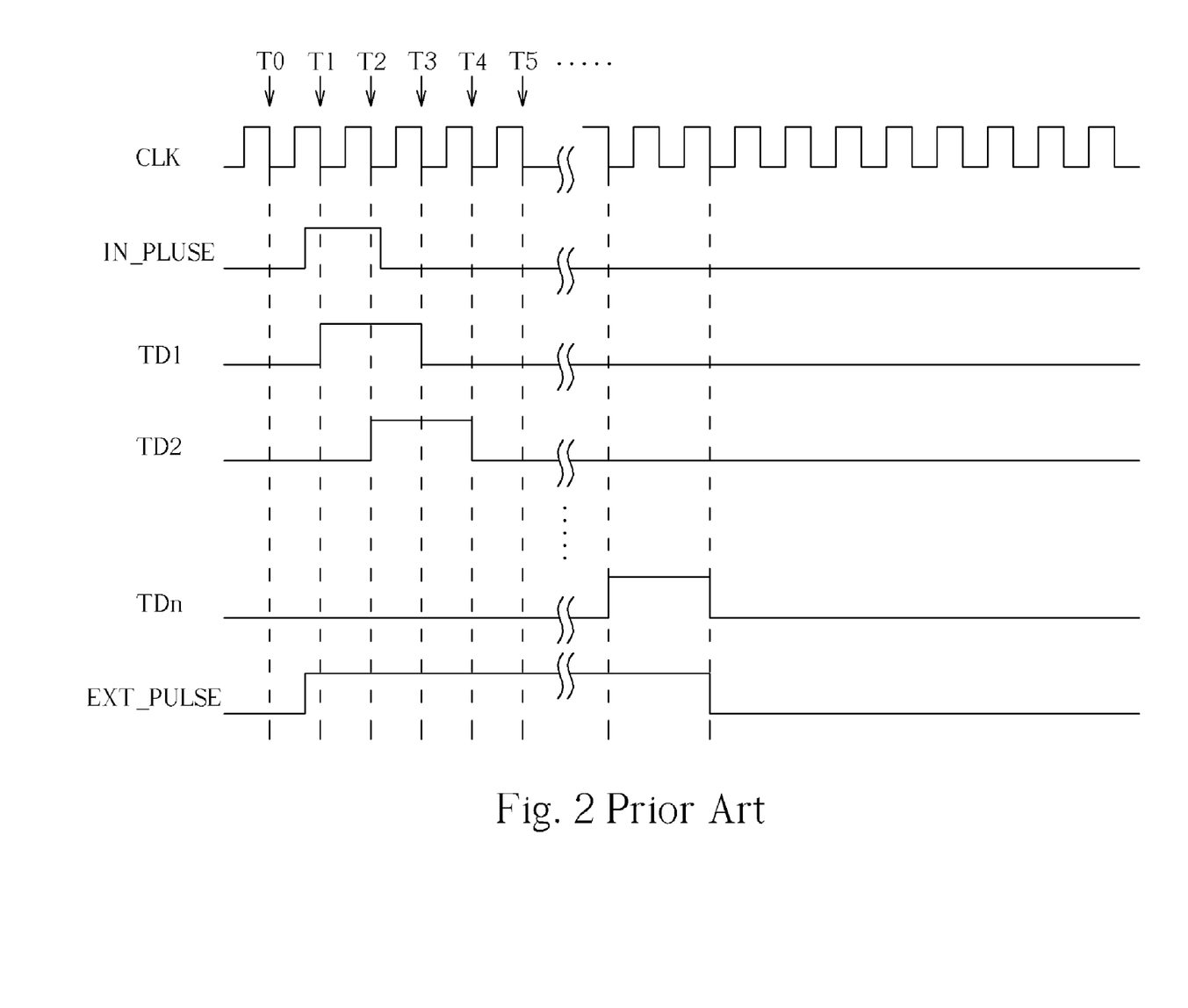
FIG. 2 is a schematic diagram of signal timing sequences in the prior art pulse extension circuit.

Therefore, when the pulse signal IN_PULSE is inputted to the pulse extension circuit 10, each D-type flip-flop is triggered according to the descending edges of the clock signal CLK, samples signals of its own data input terminal D, and outputs the sampling result to the OR gate 110 from the output terminal Q. Please refer to FIG. 2. FIG. 2 is a schematic diagram of signal timing sequences in the pulse extension circuit 10. In FIG. 2, signals TD1~TDn are respectively corresponding to signals outputted by the output terminals Q of the D-type flip-flops D1~Dn; a pulse extension signal EXT_PULSE is corresponding to a signal outputted by the output terminal OP of the OR gate 110; and timing points T0, T1, etc. are respectively corresponding to the descending edges of the clock signal CLK. The pulse signal IN_PULSE is inputted to the data input terminal D of the first D-type flip-flop D1 between the timing points T0 and T1. At this time, the first D-type flip-flop D1 is still not triggered by the descending edge of the clock signal CLK, so that the signal TD1 keeps at an initial voltage level, i.e. low logic state. Then, at the timing point T1, the first D-type flip-flop D1 is triggered by the descending edge of the clock signal CLK, and samples the signal of the data input terminal D, so as to transform the voltage level of the signal TD1 from low to high. The pulse signal IN_PULSE terminates between the timing points T2 and T3, and thus at the timing point T3, the sampling result of the data input terminal D of the first D-type flip-flop D1 is at low logic state, so as to transform the voltage level of the signal TD1 from high to low.

In other words, between the timing points T1 and T3, the signal TD1 outputted by the first D-type flip-flop D1 is at high logic state. In like manners, the D-type flip-flops D2~Dn respectively sample the signals outputted by the previous D-type flip-flops. Therefore, as shown in FIG. 2, the signal outputted by each of the D-type flip-flops delays one period of the clock signal compared with the signal outputted by the previous D-type flip-flop. Eventually, the OR gate 110 performs the OR operation for the pulse signal IN_PULSE and the signals TD1~TDn. That means, as long as one of the pulse signal IN_PULSE and the signals TD1~TDn is at high logic state, the pulse extension signal EXT_PULSE outputted by the OR gate 110 will be at high logic state. Thus, the signal duration of the pulse extension signal EXT_PULSE is about n multiples of the period the clock signal CLK, i.e., the number of the D-type flip-flops can determine a desired signal duration extended by the pulse extension circuit 10.

However, when the pulse signal is too short, such as the pulse signal initiating and terminating between the timing points T0 and T1 in FIG. 2, the first D-type flip-flop D1 cannot sample the pulse signal according to the clock signal, so that the pulse extension circuit 10 loses its efficacy. As mentioned above, the prior art pulse extension circuit directly extends the inputted pulse signal, but if the inputted pulse signal is too short, the desired pulse extension signal cannot be generated accordingly.

SUMMARY OF THE INVENTION

It is therefore a primary objective of the present invention to provide a pulse extension circuit.

The present invention discloses a pulse extension circuit for extending a pulse signal. The pulse extension circuit comprises an input unit for receiving the pulse signal; an edge detection unit coupled to the input unit for generating a initiation signal according to the pulse signal; a pulse initiation unit coupled to the edge detection unit for outputting a control signal and for adjusting a voltage level of the control signal according to the initiation signal and a first reset signal; a pulse width control unit coupled to the pulse initiation unit for outputting a termination signal according to the control signal, the first reset signal and a second reset signal; a reset unit coupled to the edge detection unit, the pulse initiation unit and the pulse width control unit for outputting the first reset signal and the second reset signal to reset the pulse initiation unit and the pulse width control unit according to the initiation signal, the termination signal and a clearing signal; and an output unit coupled to the input unit and the pulse initiation unit for extending a signal period of the pulse signal according to the pulse signal and the control signal.

These and other objectives of the present invention will no doubt become obvious to those of ordinary skill in the art after reading the following detailed description of the preferred embodiment that is illustrated in the various figures and drawings.

DETAILED DESCRIPTION

Figure 3:
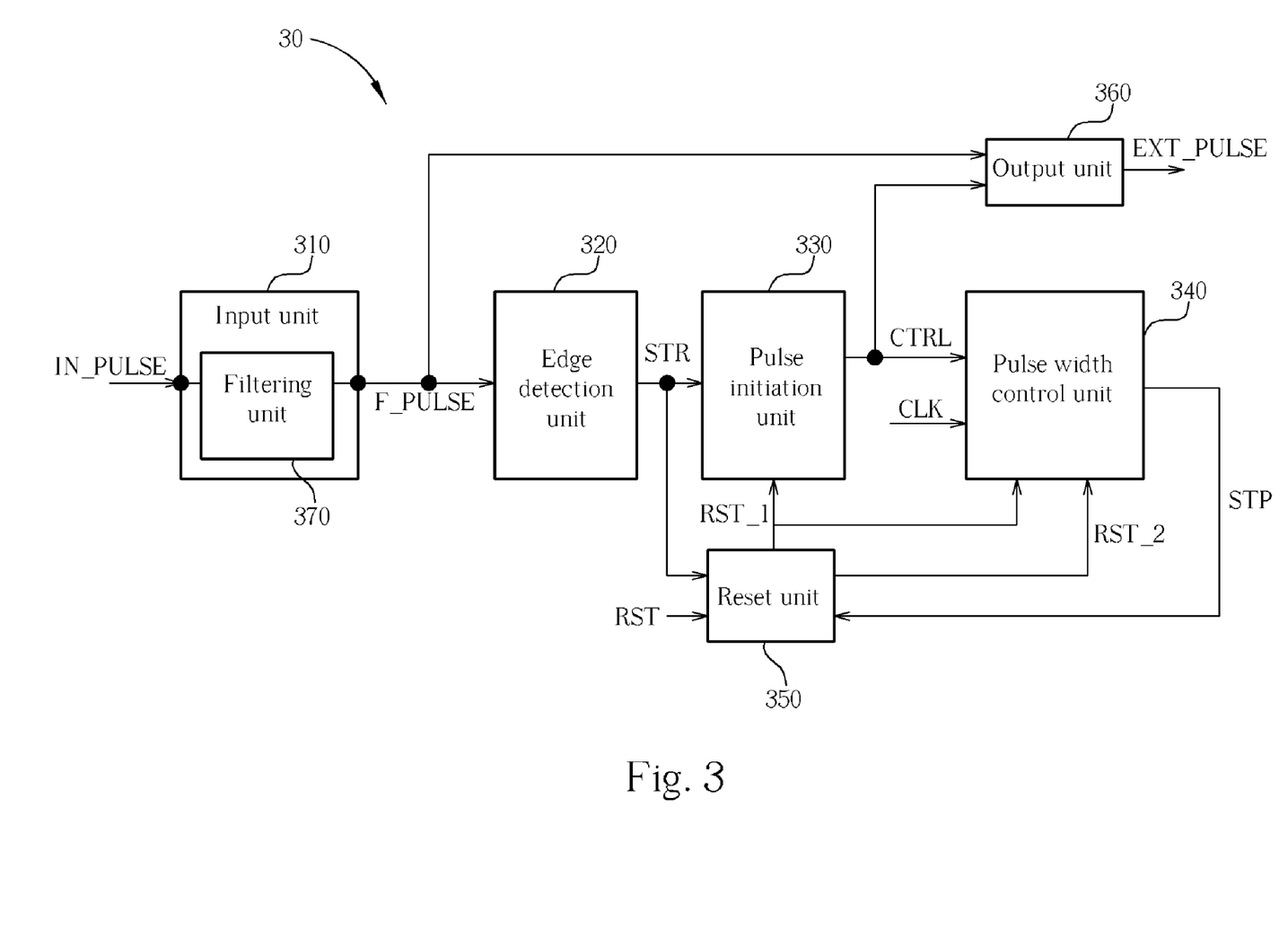
FIG. 3 is a function block diagram of a pulse extension circuit according to the present invention.

Please refer to FIG. 3. FIG. 3 is a function block diagram of a pulse extension circuit 30 according to the present invention. The pulse extension circuit 30 includes an input unit 310, an edge detection unit 320, a pulse initiation unit 330, a pulse width control unit 340, a reset unit 350 and an output unit 360. The input unit 310 is utilized for receiving a pulse signal IN_PULSE, and includes a filtering unit 370. The filtering unit 370 is utilized for filtering noises of the pulse signal IN_PULSE and generating a pulse signal F_PULSE. The edge detection unit 320 is coupled to the input unit 310, and is utilized for generating an initiation signal STR according to the pulse signal F_PULSE. The pulse initiation unit 330 coupled to the edge detection unit 320 is utilized for outputting a control signal CTRL and for adjusting a voltage level of the control signal CTRL according to the initiation signal STR and a first reset signal RST_1 outputted by the reset unit 350. The pulse width control unit 340 is coupled to the pulse initiation unit 330, and is utilized for outputting a termination signal STP to control a duration of a desired pulse extension signal according to the control signal CTRL, the first reset signal RST_1 and a second reset signal RST_2 outputted by the reset unit 350. The reset unit 350 is coupled to the pulse initiation unit 330 and the pulse width control unit 340, and is utilized for outputting the first reset signal RST_1 and the second reset signal RST_2 to reset the pulse initiation unit 330 and the pulse width control unit 340 according to the initiation signal STR, the termination signal STP and a clearing signal RST. The output unit 360 is coupled to the input unit 310 and the pulse initiation unit 330, and is utilized for extending signal duration of the pulse signal IN_PULSE according to the pulse signal F_PULSE and the control signal CTRL.

In the pulse extension circuit 30, when the pulse signal IN_PULSE is received by the input unit 310, the filtering unit 370 filters noises of the pulse signal IN_PULSE, and the edge detection unit 320 generates the initiation signal STR according to the filtered pulse signal F_PULSE. Then, the pulse initiation unit 330 converts the voltage level of the control signal CTRL to a high logic state according to the initiation signal STR, and the pulse width control unit 340 outputs the termination signal STP according to the high logic state of the control signal CTRL and a clock signal CLK. The pulse initiation unit 330 can convert the voltage level of the control signal CTRL to a low logic state according to the first reset signal RST_1 outputted by the reset unit 350. Finally, according to the pulse signal F_PULSE and the control signal CTRL, the output unit 360 can output a pulse extension signal EXT_PULSE.

Therefore, the pulse extension circuit 30 generates the initiation signal STR for initiating the pulse extension signal EXT_PULSE according to the pulse signal IN_PULSE, and generates the termination signal STP for terminating the pulse extension signal EXT_PULSE according to the desired signal duration. In this case, the present invention can prevent the circuitry from losing efficacy due to a too short inputted pulse signal. As for realization of the pulse extension circuit 30, the detail description is stated in the following.

Figure 4:
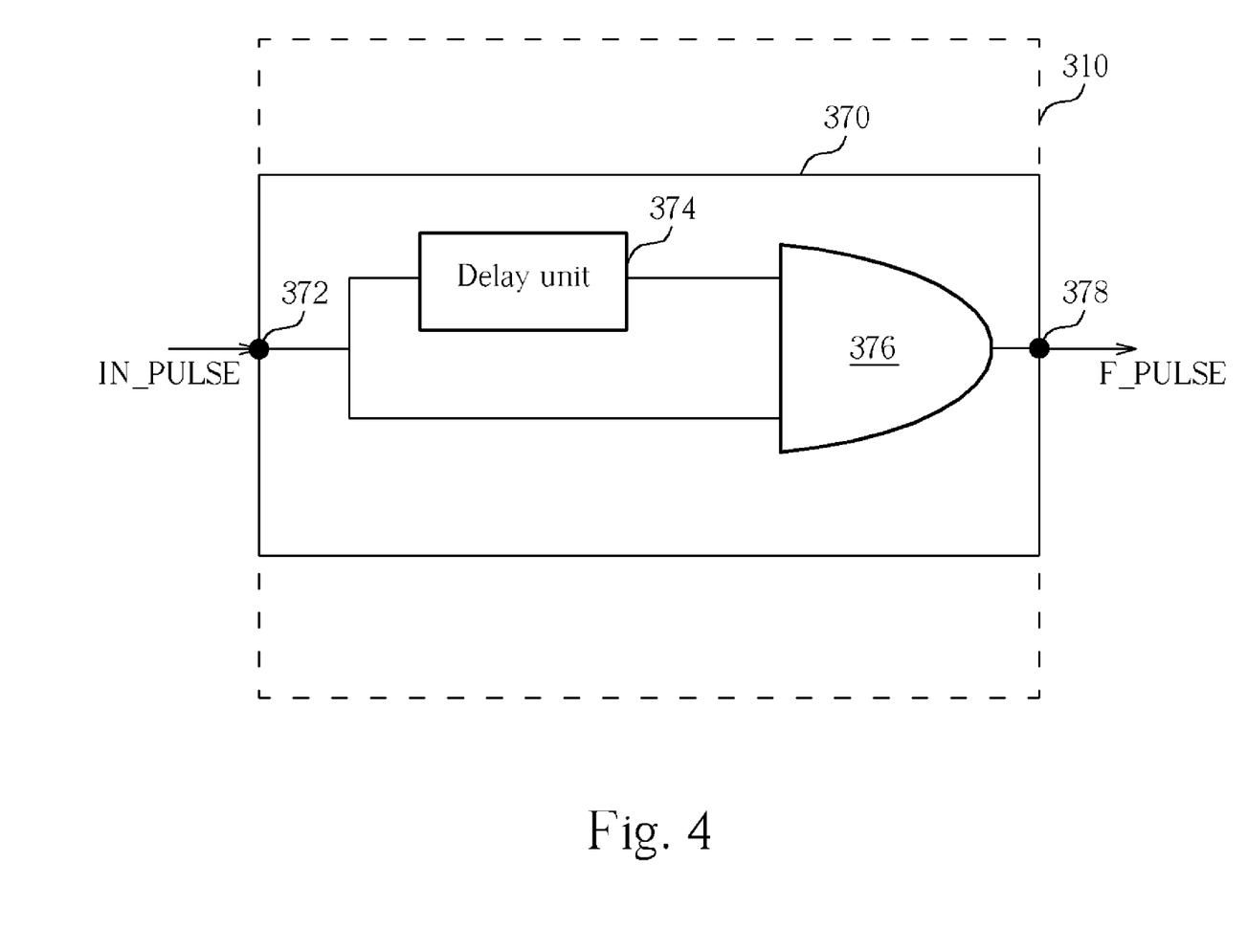
FIG. 4 is a schematic diagram of a preferred embodiment of the input unit in FIG. 3.

Firstly, please refer to FIG. 4. FIG. 4 is a schematic diagram of a preferred embodiment of the input unit 310 in FIG. 3. In the input unit 310, the filtering unit 370 is a delay circuit, which includes an input terminal 372, a delay unit 374, an AND gate 376 and an output terminal 378. The input terminal 372 is utilized for receiving the pulse signal IN_PULSE. The delay unit 374 coupled to the input terminal 372 is utilized for delaying the pulse signal IN_PULSE. The AND gate 376 is coupled to the input terminal 372 and the delay unit 374, and is utilized for generating an AND operation result according to the pulse signal IN_PULSE and signals outputted by the delay unit 374. The output terminal 378 coupled between the AND gate 376 and the edge detection unit 320 is utilized for outputting the AND operation result of the AND gate 376 to the edge detection unit 320. Therefore, in the filtering unit 370, the pulse signal IN_PULSE delayed for a predetermined time through the delay unit 374 and the original pulse signal IN_PULSE are simultaneously transmitted to the AND gate 376 for performing the AND operation, and then the AND operation result, i.e. the filtered pulse signal F_PULSE, is outputted to the edge detection unit 320 and the output unit 360. As well known by those skilled in the art, when all inputs of the AND gate are at high logic state, the AND operation result will be high. Thus, if the signal received by the input unit 310 includes noise, since the AND operation result of the noise and its delayed signal is 0, noise can be filtered out of the signal outputted by the input unit 310, so as to prevent the following operation from being interfered with by the noise. Certainly, the filtering unit 370 can also be realized by utilizing any circuits with the same function, such as an RC (resistance-capacitance) circuit.

Figure 5:
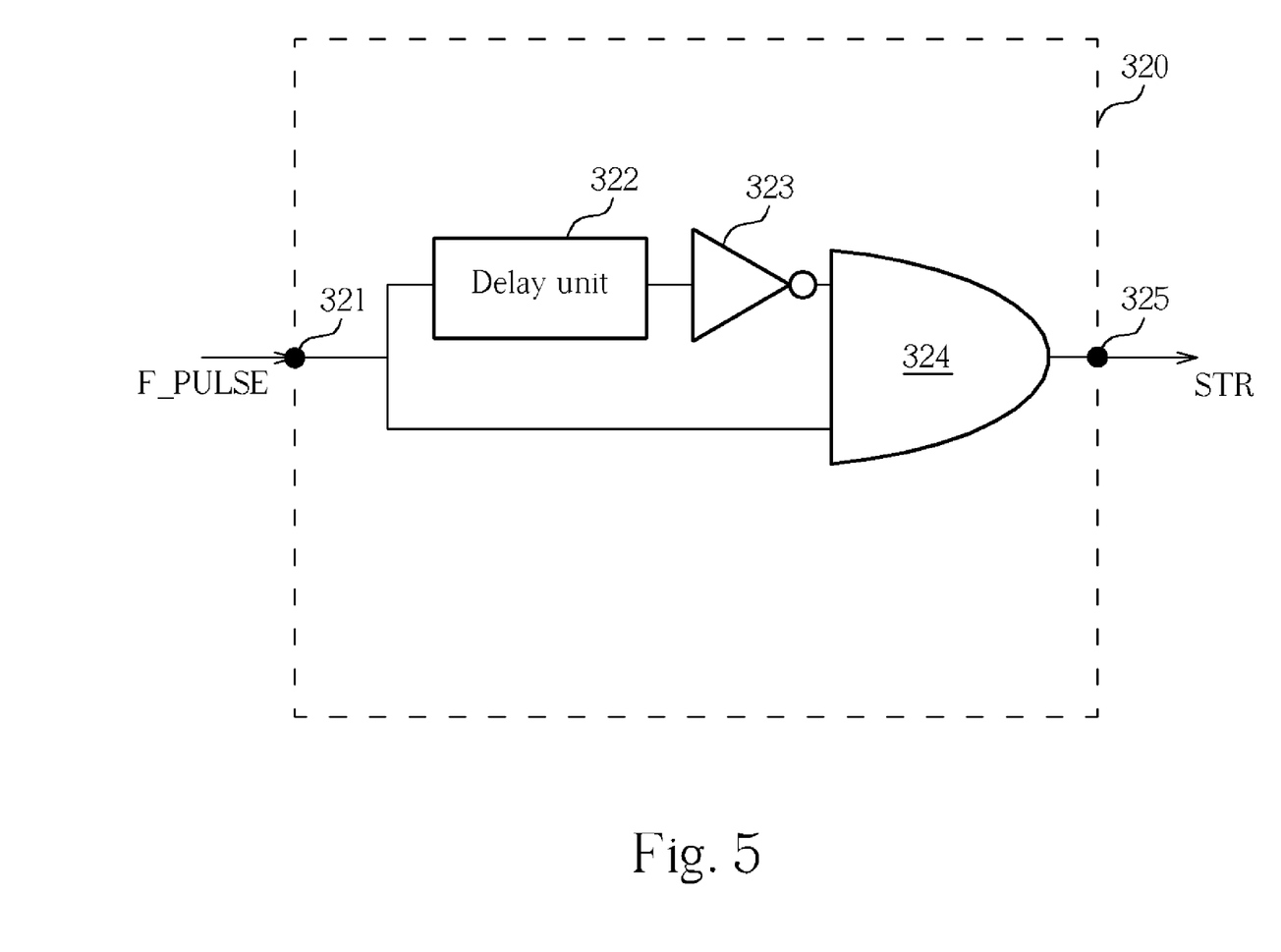
FIG. 5 is a schematic diagram of a preferred embodiment of the edge detection unit in FIG. 3.

Please refer to FIG. 5. FIG. 5 is a schematic diagram of a preferred embodiment of the edge detection unit 320 in FIG. 3. The edge detection unit 320 includes an input terminal 321, a delay unit 322, an inverter 323, an AND gate 324 and an output terminal 325. The input terminal 321 coupled to the input unit 310 is utilized for receiving the pulse signal F_PULSE outputted by the input unit 310. The delay unit 322 coupled to the input terminal 321 is utilized for delaying the pulse signal F_PULSE for a predetermined time. The inverter 323 coupled to the delay unit 322 is utilized for performing an inversion operation on the signal outputted by the delay unit 322. The AND gate 324 coupled to the input terminal 321 and the inverter 323 is utilized for performing an AND operation for the pulse signal F_PULSE and the output result of the inverter 323, and generating an AND operation result, i.e. the initiation signal STR. The output terminal 325 coupled between the AND gate 324 and the pulse initiation unit 330 is utilized for outputting the AND operation result of the AND gate 324 to the pulse initiation unit 330.

Figure 6:
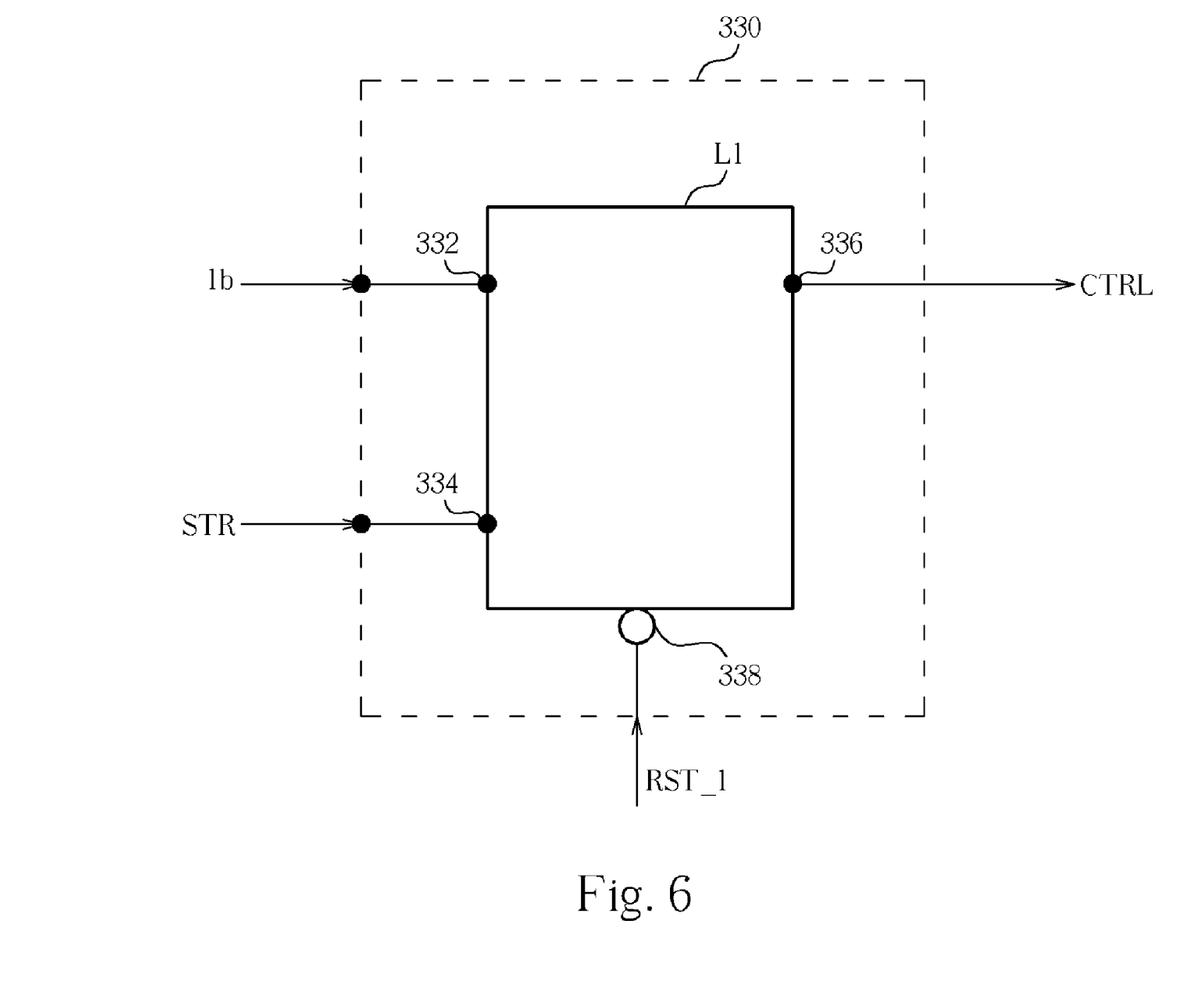
FIG. 6 is a schematic diagram of a preferred embodiment of the pulse initiation unit in FIG. 3.

Please refer to FIG. 6. FIG. 6 is a schematic diagram of a preferred embodiment of the pulse initiation unit 330 in FIG. 3. The pulse initiation unit 330 is a latch L1, and includes an input terminal 332, an enable terminal 334, an output terminal 336 and a reset terminal 338. The input terminal 332 is coupled to a high logic level signal 1b. The enable terminal 334 coupled to the edge detection unit 320 is utilized for receiving the initiation signal STR generated by the edge detection unit 320. The output terminal 336 is utilized for outputting the control signal CTRL according to the initiation signal STR and the termination signal STP. The reset terminal 338 is an inversion input terminal, and is utilized for resetting the latch L1 according to the first reset signal RST_1. Therefore, in the pulse initiation unit 330, when the enable terminal 334 of the latch L1 receives the high logic state of the initiation signal STR, the latch L1 samples the high logic level signal 1b of the input terminal 332, so as to convert the logic level of the control signal CTRL to be high and output the sampling result through the output terminal 336 to the pulse width control unit 340 and the output unit 360. On the other hand, when the logic level of the first reset signal RST_1 received by the reset terminal 338 is high, the latch L1 can be reset for converting the logic state of the control signal from high to low. That means, the pulse initiation unit 330 can generate the control signal CTRL corresponding to the duration of the desired pulse extension signal according to the initiation signal STR outputted by the edge detection unit 320 and the termination signal STP outputted by the pulse width control unit 340.

Figure 7:
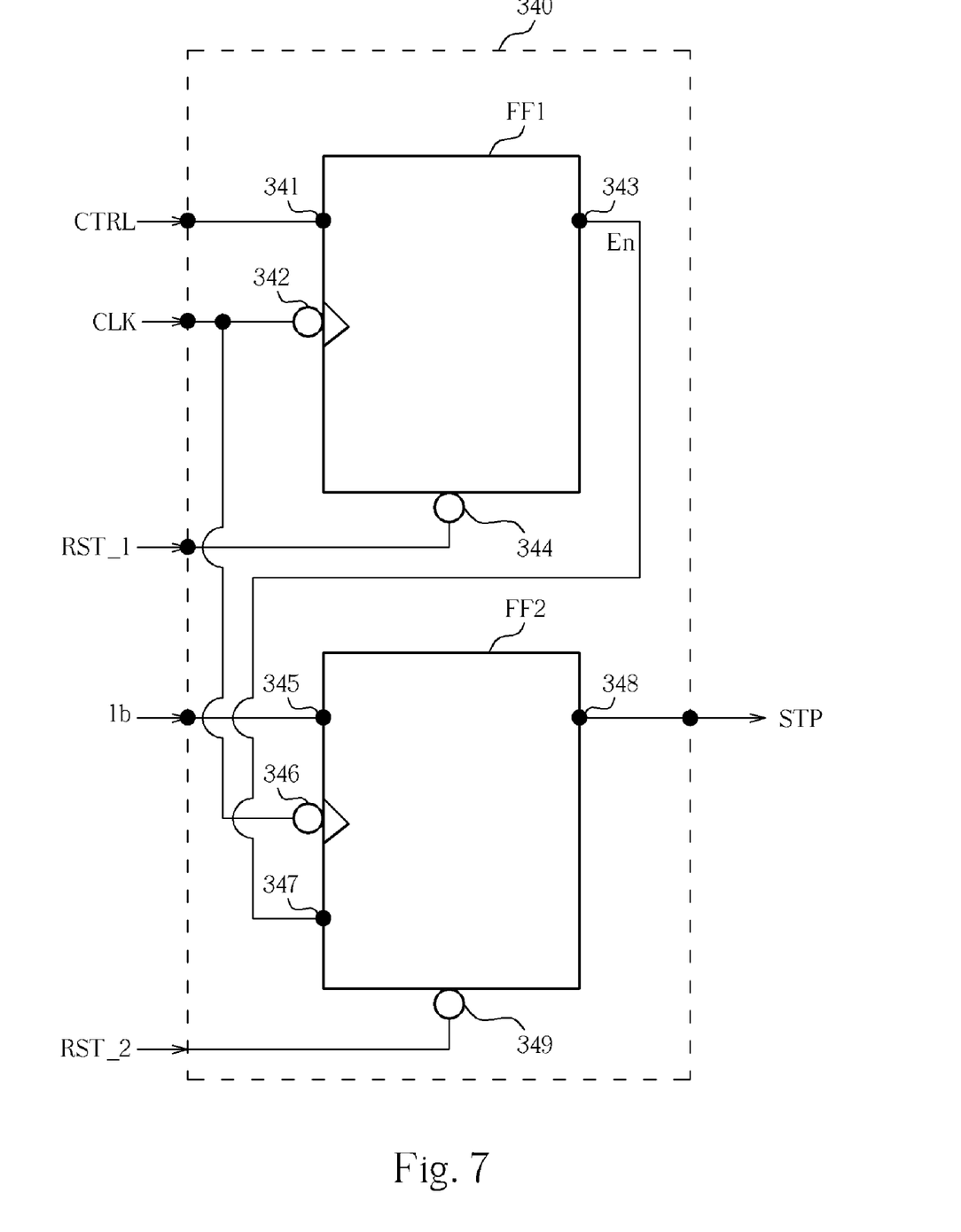
FIG. 7 is a schematic diagram of a preferred embodiment of the pulse width control unit in FIG. 3.

Please refer to FIG. 7. FIG. 7 is a schematic diagram of a preferred embodiment of the pulse width control unit 340 in FIG. 3. The pulse width control unit 340 includes a first flip-flop FF1 and a second flip-flop FF2. The first flip-flop FF1 includes an input terminal 341, a clock input terminal 342, an output terminal 343 and a reset terminal 344. The input terminal 341 coupled to the pulse initiation unit 330 is utilized for receiving the control signal CTRL. The clock input terminal 342 is utilized for receiving the clock signal CLK. The output terminal 343 is utilized for outputting an enable signal En according to the clock signal CLK and the control signal CTRL. The reset terminal 344 is an inversion input terminal, and is utilized for resetting the first flip-flop FF1 according to the first reset signal RST_1 outputted by the reset unit 350.

The second flip-flop FF2 includes an input terminal 345, a clock input terminal 346, an enable terminal 347, an output terminal 348 and a reset terminal 349. The input terminal 345 is coupled to the high logic level signal 1b. The clock input terminal 346 is utilized for receiving the clock signal CLK. The enable terminal 347 is utilized for receiving the enable signal En outputted by the first flip-flop FF1. The output terminal 348 is utilized for outputting the termination signal STP according to the enable signal En and the clock signal CLK. The reset terminal 349 is an inversion input terminal, and is utilized for resetting the termination signal STP according to the second reset signal RST_2 outputted by the reset unit 350.

In the pulse width control unit 340, the first flip-flop FF1 is triggered according to the descending edges of the clock signal CLK, samples the signal of the input terminal 341, and outputs the sampling result to the enable terminal 347 of the second flip-flop FF2. Similarly, the second flip-flop FF2 is also triggered according to the descending edges of the clock signal CLK, samples the signal of the input terminal 345, and outputs the sampling result through the output terminal 348. Furthermore, the second flip-flop FF2 can latch the output signal of the output terminal 348 according to the logic level of the enable terminal 347. Therefore, when the enable terminal 347 of the second flip-flop FF2 receives the high logic level of the enable signal En outputted by the first flip-flop FF1, the second flip-flop FF2 then can be triggered by the descending edges of the clock signal CLK, sample the signal of the input terminal 345, and output the termination signal STP through the output terminal 348. Moreover, the pulse width control unit 340 shown in FIG. 6 is just an exemplary embodiment, and those skilled in the art can make realization by any circuits with the same function, such as a counter.

Figure 8:
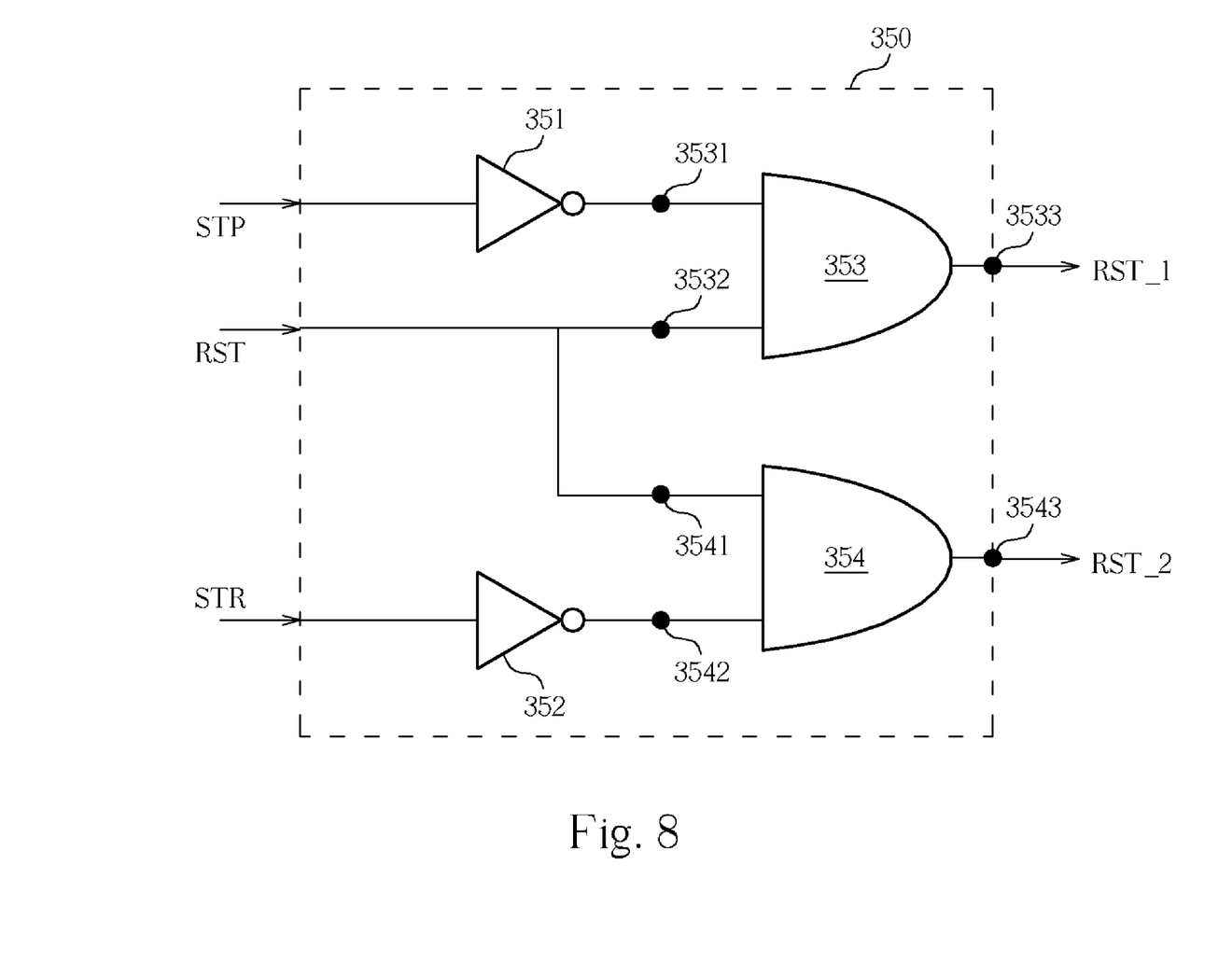
FIG. 8 is a schematic diagram of a preferred embodiment of the reset unit in FIG. 3.

Please refer to FIG. 8. FIG. 8 is a schematic diagram of a preferred embodiment of the reset unit 350 in FIG. 3. The reset unit 350 includes a first inverter 351, a second inverter 352, a first AND gate 353 and a second AND gate 354. The first inverter 351 coupled to the pulse width control unit 340 is utilized for outputting an inversion result of the termination signal STP. The second inverter 352 coupled to the edge detection unit 320 is utilized for outputting an inversion result of the initiation signal STR. The first AND gate 353 includes a first input terminal 3531, a second input terminal 3532 and an output terminal 3533, and is utilized for performing an AND operation on the inversion result of the termination signal STP and the clearing signal RST to output the first reset signal RST_1. The second AND gate 354 includes a first input terminal 3541, a second input terminal 3542 and an output terminal 3543, and is utilized for performing an AND operation on the inversion result of the initiation signal STR and the clearing signal RST to output the second reset signal RST_2.

Therefore, in the reset unit 350, the clearing signal RST keeps at logic high state in normal conditions, and when the high logic level of the termination signal STP is outputted by the pulse width control unit 340, the AND gate 353 outputs the low logic level AND operation result to the pulse initiation unit 330 and the first flip-flop FF1 of the pulse width control unit 340 for resetting the control signal CTRL and the enable signal En. Similarly, when the edge detection unit 320 outputs the high logic level of the initiation signal STR, the second AND gate 354 outputs the low logic level AND operation result to the second flip-flop FF2 of the pulse width control unit 340 for resetting the termination signal STP. Furthermore, when the whole pulse extension circuit 30 needs to be reset, the clearing signal RST can be switched to be low, so that both the first reset signal RST_1 and the second reset signal RST_2 can be converted to the low logic state for restarting the whole system.

Figure 9:
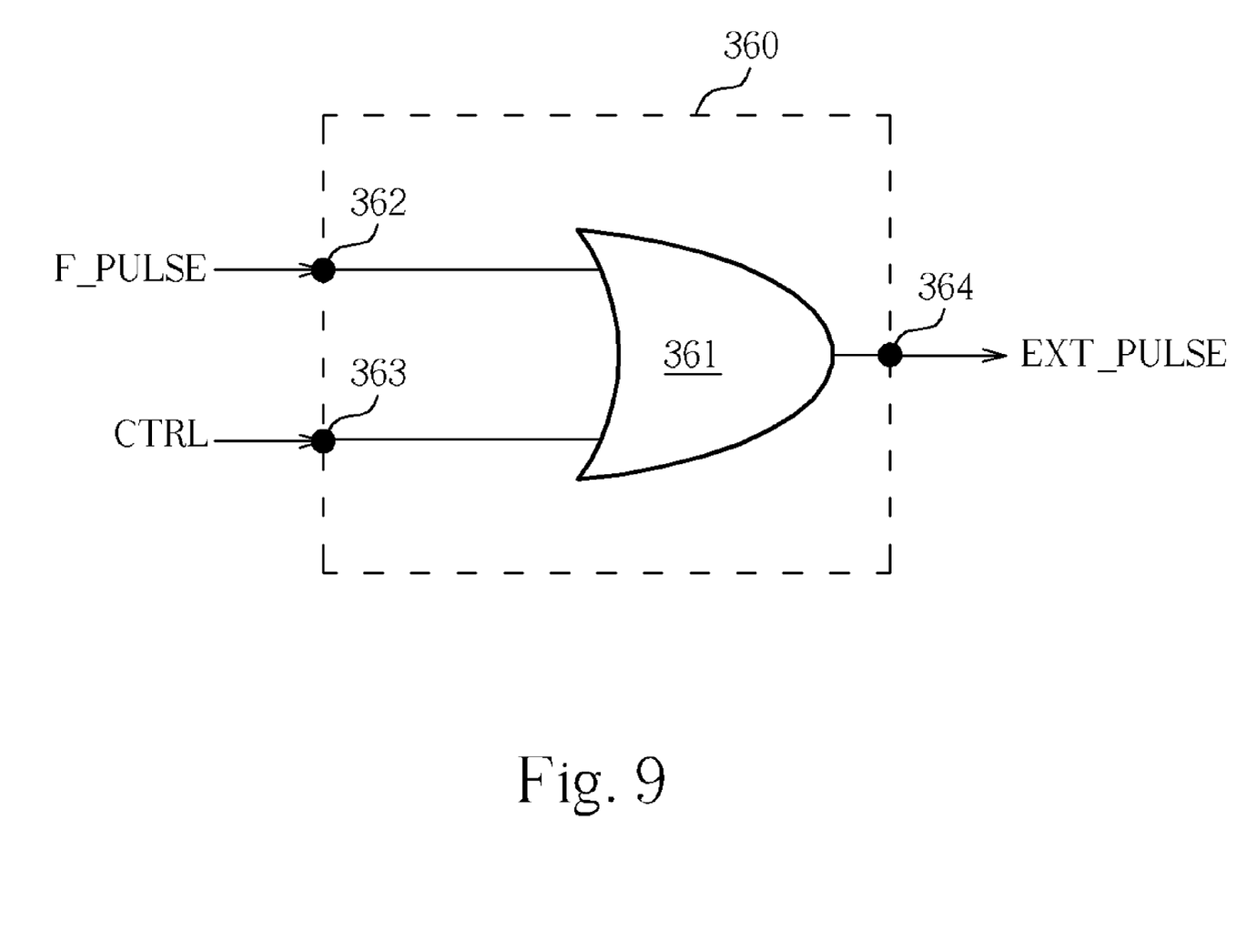
FIG. 9 is a schematic diagram of a preferred embodiment of the output unit in FIG. 3.

Please refer to FIG. 9. FIG. 9 is a schematic diagram of a preferred embodiment of the output unit 360 in FIG. 3. The output unit 360 is an OR gate 361, and is utilized for receiving the filtered pulse signal F_PULSE outputted by the input unit 310 through a first input terminal 362, for receiving the control signal CTRL outputted by pulse initiation unit 330 through a second input terminal 363, and for outputting the pulse extension signal EXT_PULSE through a output terminal 364. Therefore, the output unit 360 can output the pulse extension signal EXT_PULSE according to the OR operation result of the pulse signal F_PULSE and the control signal CTRL. That means, as long as one of the pulse signal F_PULSE and the control signal CTRL is at high logic state, the logic level of the pulse extension signal EXT_PULSE outputted by the output unit 360 is high.

Figure 10:
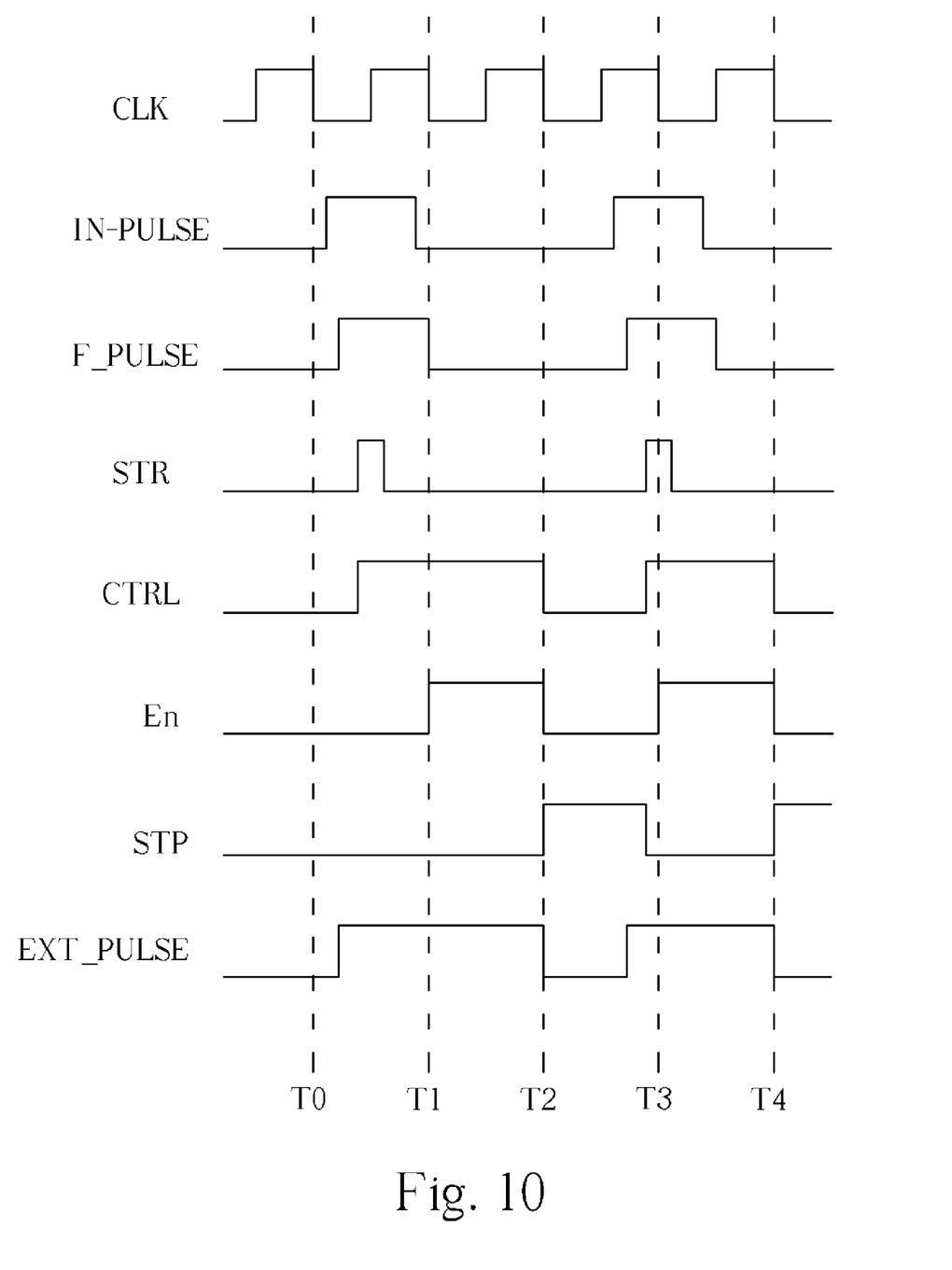
FIG. 10 is a schematic diagram of signal timing sequences in the pulse extension circuit.

Please refer to FIG. 10. FIG. 10 is a schematic diagram of signal timing sequences in the pulse extension circuit 30. Timing points T0, T1, etc. are individually corresponding to descending edges of the clock signal CLK. As mentioned above, when a pulse signal IN_PULSE is inputted into the pulse extension circuit 30, the input unit 310 can filter noises of the pulse signal IN_PULSE, and output the filtered pulse signal F_PULSE. Then, the edge detection unit 320 can generate and output the initiation signal STR to the pulse initiation unit 330 according to the pulse signal F_PULSE. When the pulse initiation unit 330 receives the initiation signal STR, the logic state of the control signal CTRL is converted to logic high. When the high logic level of the control signal CTRL is received by the pulse width control unit 340, the first flip-flop FF1 of the pulse width control unit 340 can generate the high logic state of the enable signal En to enable the second flip-flop FF2 of the pulse width control unit 340 according to the descending edge of the clock signal CLK (at the timing point T1). Thus, at the timing point T2, the second flip-flop FF2 of the pulse width control unit 340 can output the termination signal STP to the reset unit 350 according to the descending edge of the clock signal CLK. In the meantime, the reset unit 350 resets the high logic state of the control signal CTRL and the enable signal En according to the high logic state of the termination signal STP. Therefore, the output unit 360 can generate the desired pulse extension signal EXT_PULSE according to the filtered pulse signal F_PULSE and the control signal CTRL.

Furthermore, when a next pulse signal is inputted (between the timing points T2 and T3), the reset unit 350 can reset the high logic state of the termination signal STP for generating a next pulse extension signal EXT_PULSE according to a next initiation signal STR generated by the edge detection unit 320. Please note that, the inputted pulse signal IN_PULSE in this embodiment initiates and terminates between the timing points T0 and T1, i.e. the duration of the pulse signal IN_PULSE is shorter than the period of the clock signal CLK. In this case, when utilizing the prior art pulse extension circuit 10, the desired pulse extension signal EXT_PULSE cannot be obtained.

Moreover, in the present invention, the duration of the pulse extension signal generated by the pulse extension circuit 30 is determined by the duration of the control signal. Therefore, those skilled in the art can make modifications for the pulse width control unit 340 according to desired durations of the pulse extension signal, so as to generate the desired pulse extension signal.

As mentioned above, the pulse extension circuit generates an initiation signal for initiating the pulse extension circuit according to the inputted pulse signal, and generates a termination signal for terminating the pulse extension circuit according to the desired signal duration, so as to generate the desired pulse extension signal. Therefore, different from the prior art directly extending the inputted pulse signal, the present invention can prevent the circuitry from losing efficacy due to a too short inputted pulse signal.

Those skilled in the art will readily observe that numerous modifications and alterations of the device and method may be made while retaining the teachings of the invention.

What is claimed is:

1. A pulse extension circuit for extending a pulse signal comprising:
    an input unit for receiving the pulse signal;
    an edge detection unit coupled to the input unit for generating an initiation signal according to the pulse signal;
    a pulse initiation unit coupled to the edge detection unit for outputting a control signal and for adjusting a voltage level of the control signal according to the initiation signal and a first reset signal;
    a pulse width control unit coupled to the pulse initiation unit for outputting a termination signal according to the control signal, the first reset signal and a second reset signal;
    a reset unit coupled to the edge detection unit, the pulse initiation unit and the pulse width control unit for outputting the first reset signal and the second reset signal to reset the pulse initiation unit and the pulse width control unit according to the initiation signal, the termination signal and a clearing signal; and
    an output unit coupled to the input unit and the pulse initiation unit for extending a signal period of the pulse signal according to the pulse signal and the control signal.

2. The pulse extension circuit of claim 1, wherein the input unit comprises a filtering unit for filtering noises of the pulse signal.

3. The pulse extension circuit of claim 2, wherein the filtering unit is a delay circuit.

4. The pulse extension circuit of claim 3, wherein the filtering unit comprises:
    an input terminal for receiving the pulse signal;
    a delay unit coupled to the input terminal for delaying the pulse signal;
    an AND gate coupled to the input terminal and the delay unit for outputting an AND operation result; and
    an output terminal coupled between the AND gate and the edge detection unit for outputting the AND operation result to the edge detection unit.

5. The pulse extension circuit of claim 2, wherein the filtering unit is an RC (resistance-capacitance) circuit.

6. The pulse extension circuit of claim 1, wherein the edge detection unit comprises:
    an input terminal coupled to the input unit;
    a delay unit coupled to the input terminal for delaying the pulse signal;
    an inverter coupled to the delay unit for outputting an inversion operation result;
    an AND gate coupled to the input terminal and the inverter for outputting an AND operation result; and
    an output terminal coupled between the AND gate and the pulse initiation unit for outputting the AND operation result to the pulse initiation unit.

7. The pulse extension circuit of claim 1, wherein the pulse initiation unit is a latch, the latch comprising:
    an input terminal coupled to a high voltage level signal;
    an enable terminal coupled to the edge detection unit for receiving the initiation signal;
    an output terminal coupled to the pulse width control unit and the output unit for outputting the control signal; and
    a reset terminal coupled to the reset unit for receiving the first reset signal to reset the latch.

8. The pulse extension circuit of claim 1, wherein the pulse width control unit comprises:
    a first flip-flop comprising:
        a first input terminal coupled to the pulse initiation unit for receiving the control signal;
        a first clock input terminal for receiving a clock signal;
        a first output terminal for outputting an enable signal according to the clock signal and the control signal; and
        a first reset terminal coupled to the reset unit for receiving the first reset signal to reset the first flip-flop; and
    a second flip-flop comprising:
        a second input terminal coupled to a high voltage level signal;
        a second clock input terminal for receiving the clock signal;
        an enable terminal for receiving the enable signal;
        a second output terminal for outputting the termination signal according to the enable signal and the clock signal; and
        a second reset terminal coupled to the reset unit for receiving the second reset signal to reset the second flip-flop.

9. The pulse extension circuit of claim 1, wherein the pulse width control unit is a counter.

10. The pulse extension circuit of claim 1, wherein the output unit is an OR gate, the OR gate comprising:
- a first input terminal coupled to the input unit for receiving the pulse signal;
- a second input terminal coupled to the pulse initiation unit for receiving the control signal; and
- an output terminal for outputting an OR operation result of the pulse signal and the control signal.

11. The pulse extension circuit of claim 1, wherein the reset unit comprises:
- a first inverter coupled to the pulse width control unit for outputting an inversion result of the termination signal;
- a second inverter coupled to the edge detection unit for outputting an inversion result of the initiation signal;
- a first AND gate comprising:
  - a first input terminal coupled to the first inverter;
  - a second input terminal for receiving the clearing signal; and
  - an output terminal coupled to the pulse initiation unit and the pulse width control unit for outputting an AND operation result of the inversion result outputted by the first inverter and the clearing signal to be the first reset signal; and
- a second AND gate comprising:
  - a first input terminal coupled to the second inverter;
  - a second input terminal for receiving the clearing signal; and
  - an output terminal coupled to the pulse width control unit for outputting an AND operation result of the inversion result outputted by the second inverter and the clearing signal to be the second reset signal.

* * * * *